US007028277B2

(12) United States Patent
Chang et al.

(10) Patent No.: US 7,028,277 B2
(45) Date of Patent: Apr. 11, 2006

(54) PROCESS RELATED DEVIATION CORRECTED PARASITIC CAPACITANCE MODELING METHOD

(75) Inventors: Victor C. Y. Chang, Tucheng (TW); Chung-Shi Chiang, Changhua (TW); Chien-Wen Chen, Hsin Chu (TW); Harry Chuang, Austin, TX (US); Hsin-Yi Lee, Hsin Chu (TW); Yu-Tai Chia, San Jose, CA (US)

(73) Assignee: Taiwan Semiconductor Manufacturing Co., Ltd., Hsin Chu (JP)

( * ) Notice: Subject to any disclaimer, the term of this patent is extended or adjusted under 35 U.S.C. 154(b) by 262 days.

(21) Appl. No.: 10/326,500

(22) Filed: Dec. 20, 2002

(65) Prior Publication Data
US 2004/0123257 A1  Jun. 24, 2004

(51) Int. Cl.
*G06F 17/50* (2006.01)
*G06F 9/45* (2006.01)

(52) U.S. Cl. .................... 716/5; 716/1; 716/6; 716/10; 716/12

(58) Field of Classification Search ................ 716/1–5, 716/6, 10, 12
See application file for complete search history.

(56) References Cited

U.S. PATENT DOCUMENTS

| 5,761,080 | A |  | 6/1998 | DeCamp et al. | |
| 6,061,508 | A |  | 5/2000 | Mehrotra et al. | |
| 6,068,660 | A | * | 5/2000 | Lu | 703/2 |
| 6,182,269 | B1 | * | 1/2001 | Laubhan | 716/5 |
| 6,243,653 | B1 | * | 6/2001 | Findley | 702/65 |
| 6,430,729 | B1 | * | 8/2002 | Dewey et al. | 716/4 |
| 6,436,807 | B1 | * | 8/2002 | Cwynar et al. | 438/619 |
| 6,449,754 | B1 | * | 9/2002 | You et al. | 716/5 |
| 6,542,834 | B1 | * | 4/2003 | Dixit | 702/65 |
| 6,543,035 | B1 | * | 4/2003 | Ohba et al. | 716/5 |
| 6,606,729 | B1 | * | 8/2003 | Gross et al. | 716/1 |
| 6,643,831 | B1 | * | 11/2003 | Chang et al. | 716/4 |
| 6,728,937 | B1 | * | 4/2004 | Wakita et al. | 716/4 |
| 6,779,157 | B1 | * | 8/2004 | Kondo | 716/2 |
| 2003/0101418 | A1 | * | 5/2003 | Draxler et al. | 716/1 |
| 2003/0237064 | A1 | * | 12/2003 | White et al. | 716/5 |

* cited by examiner

Primary Examiner—Vuthe Siek
Assistant Examiner—Magid Y. Dimyan
(74) Attorney, Agent, or Firm—Tung & Assoc

(57) ABSTRACT

Each of a method for determining a parasitic capacitance and an apparatus for determining the parasitic capacitance provides for an experimental correlation within a parasitic capacitance model of a series of conductor layer nominal dimensions and spacings with a process related deviation to provide a series of conductor layer actual dimensions and spacings. The method and the apparatus further provide for determining the parasitic capacitance while employing the conductor layer actual dimensions and spacings. The parasitic capacitance is thus determined with enhanced accuracy.

20 Claims, 2 Drawing Sheets

PROCESS RELATED DEVIATION CORRECTED PARASITIC CAPACITANCE MODELING METHOD

BACKGROUND OF THE INVENTION

1. Field of the Invention

The present invention relates generally to capacitance modeling methods employed when designing and fabricating microelectronic products. More particularly, the present invention relates to refined capacitance modeling methods employed for designing and fabricating microelectronic products.

2. Description of the Related Art

Common in the microelectronic product fabrication art is the use of modeling methods and apparatus for modeling anticipated microelectronic product electrical performance prior to fabricating microelectronic products. Expected electrical performance modeling is desirable within the context of microelectronic product fabrication since it generally provides for a more efficient and effective process definition when fabricating microelectronic products.

Of particular interest within microelectronic product fabrication are parasitic capacitance modeling methods which are intended to quantify parasitic capacitance between conductor layers which connect and interconnect active devices within microelectronic products. Parasitic capacitance may lead to undesirable increases in microelectronic product operating speed, undesirable decreases in microelectronic product operating speed or undesirable electrical noise within a microelectronic product.

While parasitic capacitance modeling is thus desirable within microelectronic product design and fabrication, it is nonetheless not entirely without problems. In that regard, it is often difficult to accurately model parasitic capacitance within microelectronic products.

It is thus desirable within the microelectronic product fabrication art to provide methods and apparatus which provide for a more accurate parasitic capacitance modeling when designing and fabricating microelectronic products. It is towards the foregoing object that the present invention is directed.

Various parasitic capacitance modeling methods and apparatus have been disclosed within the microelectronic product fabrication art. Included but not limiting among the methods and apparatus are those disclosed within: (1) DeCamp et al., in U.S. Pat. No. 5,761,080 (a parasitic capacitance modeling method and apparatus which provides for partitioning of microelectronic product conductor layers into simpler geometric shapes with respect to which overlap capacitance and fringe capacitance may be determined); and (2) Mehrotra et al., in U.S. Pat. No. 6,061,508 (a parasitic capacitance modeling method and apparatus which provides for three dimensional capacitance determinations as well as two dimensional capacitance determinations).

The teachings of each of the foregoing references are incorporated herein fully by reference.

Desirable within the microelectronic product fabrication art are additional methods and apparatus which provide for more accurate parasitic capacitance modeling. It is towards the foregoing object that the present invention is directed.

SUMMARY OF THE INVENTION

A first object of the invention is to provide a method for modeling a parasitic capacitance when fabricating a microelectronic product.

A second object of the invention is to provide a method in accord with the first object of the invention, wherein the parasitic capacitance is more accurately modeled.

In accord with the objects of the invention, the invention provides a method for modeling a parasitic capacitance when fabricating a microelectronic product and an apparatus for modeling the parasitic capacitance when fabricating the microelectronic product.

In accord with the invention, the method first provides a parasitic capacitance model which determines a parasitic capacitance based upon a series of conductor layer dimensions and spacings. The method then provides for inputting into the parasitic capacitance model a series of conductor layer nominal dimensions and spacings whose parasitic capacitance is desired to be determined while employing the parasitic capacitance model. The method further provides for correlating experimentally within the parasitic capacitance model the series of conductor layer nominal dimensions and spacings with a process related deviation to provide a series of conductor layer actual dimensions and spacings. Finally, the method provides for determining, while employing the parasitic capacitance model, the parasitic capacitance based upon the conductor layer actual dimensions and spacings.

An apparatus in accord with the present invention derives and operates in accord with the method of the invention.

The invention provides a method for modeling a parasitic capacitance when fabricating a microelectronic product, wherein the parasitic capacitance is more accurately modeled.

The present invention realizes the foregoing object by correlating experimentally within a parasitic capacitance model a series of conductor layer nominal dimensions and spacings with a process related deviation to provide a series of conductor layer actual dimensions and spacings, such that a parasitic capacitance may be determined with enhanced accuracy while employing the series of conductor layer actual dimensions and spacings.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for modeling a parasitic capacitance when fabricating a microelectronic product, wherein the parasitic capacitance is more accurately modeled.

The invention realizes the foregoing object by correlating experimentally within a parasitic capacitance model a series of conductor layer nominal dimensions and spacings with a process related deviation to provide a series of conductor layer actual dimensions and spacings, such that a parasitic capacitance may be determined while employing the series of conductor layer actual dimensions and spacings.

Figure 1:
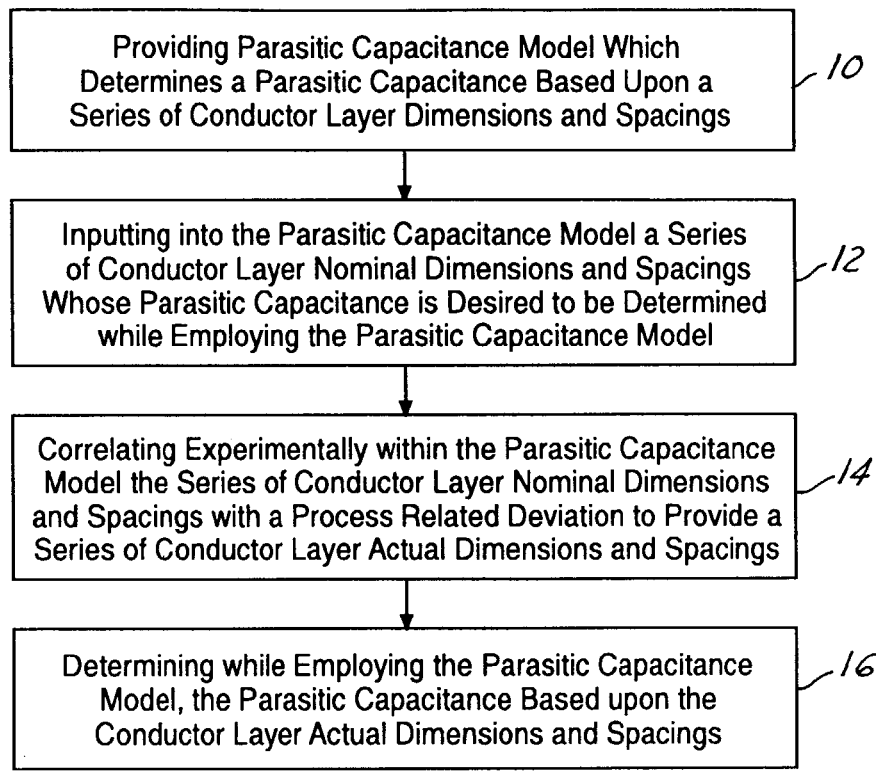
FIG. 1 shows a schematic process flow diagram describing, in general, the invention.

FIG. 1 shows a schematic process flow diagram illustrating a progressive series of process steps in accord with the invention.

In accord with process step 10, the invention first provides a parasitic capacitance model which determines a parasitic capacitance based upon a series of conductor layer dimensions and spacings. The parasitic capacitance model may be otherwise conventional in the microelectronic product fabrication art and may, for example and without limitation, be of a variety as disclosed within the related art references disclosed within the Description of the Related Art, the teachings of which are incorporated herein fully by reference. Typically, the parasitic capacitance model will determine a parasitic capacitance for a series of conductor layers in at least two dimensions and preferably three dimensions. Preferably, the parasitic capacitance is determined employing overlap capacitance and fringe capacitance.

In accord with process step 12, a series of conductor layer nominal dimensions and spacings is inputted into the parasitic capacitance model for a microelectronic product whose parasitic capacitance it is desired to determine while employing the parasitic capacitance model. Within the invention, the series of conductor layer nominal dimensions and spacings is intended to derive from a microelectronic product selected from the group including but not limited to semiconductor products and ceramic substrate products. The series of conductor layer nominal dimensions is also generally intended to include a three dimensional array of conductor layers separated by at least one dielectric material of known dielectric constant. Typically, the conductor layer nominal dimensions and spacings will be in a range of from about 0.1 to about 10 microns.

In accord with process step 14, the invention provides for correlating experimentally within the parasitic capacitance model the series of conductor layer nominal dimensions and spacings with a process related deviation to provide a series of conductor layer actual dimensions and spacings. Within the invention, the process related deviation may derive from any of several processes employed for forming the series of conductor layers within the microelectronic product. Examples include deposition process related deviations and etch process related deviations. As will be discussed in greater detail below, and as is of particular importance within the context of the invention, the process related deviation may include planarizing process related deviations such as chemical mechanical polish (CMP) planarizing process related deviations.

In accord with process step 16, the invention finally provides for determining, while employing the parasitic capacitance model, the parasitic capacitance based upon the conductor layer actual dimensions and spacings. By employing within the invention the conductor layer actual dimensions and spacings (rather than conductor layer nominal dimensions and spacings) when determining a parasitic capacitance for a series of conductor layers within a microelectronic product, the parasitic capacitance is more accurately determined.

Figure 2:
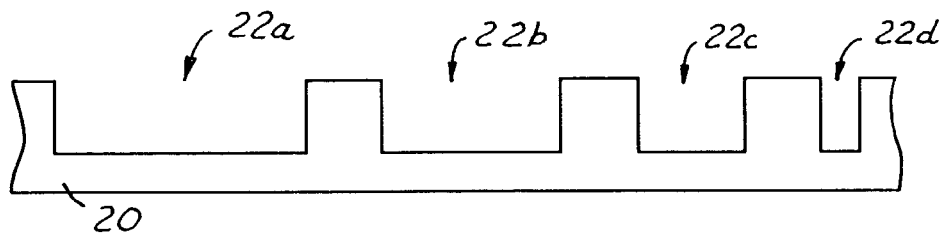
FIG. 2, FIG. 3 and FIG. 4 show a series of schematic cross-sectional diagrams illustrating a chemical mechanical polish (CMP) planarizing patterned conductor layer process related deviation whose effects may be modeled in accord with the invention.
Figure 3:
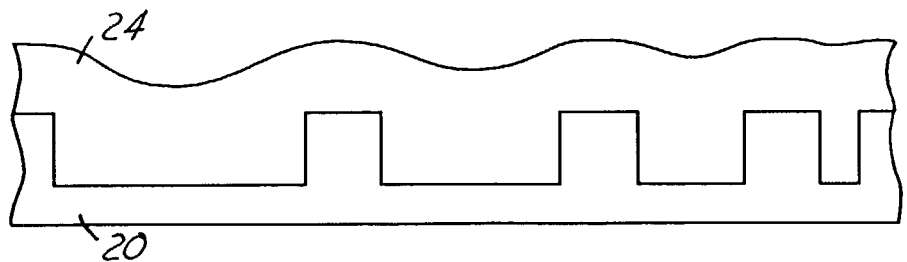
Figure 4:
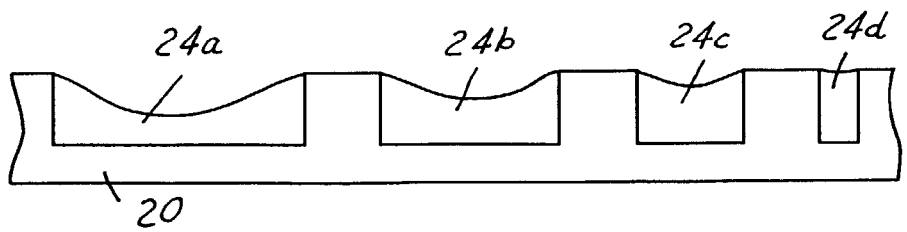

FIG. 2, FIG. 3 and FIG. 4 show a series of schematic cross-sectional diagrams illustrating a chemical mechanical polish (CMP) planarizing patterned conductor layer process related deviation whose effects may be modeled in accord with the invention.

FIG. 2 illustrates a substrate 20 having formed therein a series of apertures 22a, 22b, 22c and 22d.

Within the invention, the substrate 20 may comprise a semiconductor substrate, a ceramic substrate or any other variety of microelectronic substrate within or over which may be formed a series of conductor layers whose parasitic capacitance may be modeled in accord with the invention. Typically, the substrate 10 comprises, in addition to a semiconductor substrate or a ceramic substrate, additional patterned conductor layers separated by dielectric layers such as to provide a three dimensional array for parasitic capacitance determination. In addition, the substrate 20, typically but not exclusively when the substrate 20 comprises a semiconductor substrate, has formed therein and/or thereupon microelectronic devices such as resistors, transistors, diodes and capacitors.

As is illustrated in FIG. 2, the series of apertures 22a, 22b, 22c and 22d may be of progressively diminishing linewidth, generally from a widest linewidth of aperture 22a of from about 5 to about 10 microns to a narrowest linewidth of aperture 22d of from about 0.1 to about 0.5 microns. Typically, each of the apertures 22a, 22b, 22c and 22d is formed to a depth of from about 4000 to about 10000 angstroms within the substrate 20.

FIG. 3 illustrates the results of further processing of the substrate 20 as illustrated in FIG. 2.

FIG. 3 illustrates a blanket conductor layer 24, which is typically a blanket copper containing conductor layer (being formed upon an optional barrier layer) formed upon the substrate 20 and filling each of the apertures 22a, 22b, 22c and 22d. Typically, the blanket conductor layer 24 is formed to a thickness of from about 8000 to about 16000 angstroms.

FIG. 4 illustrates the results of further processing of the substrate 20 as illustrated in FIG. 3.

FIG. 4 illustrates the results of planarizing the blanket conductor layer 24 while typically employing a chemical mechanical polish planarizing method, to form a series of patterned conductor layers 24a, 24b, 24c and 24d within the series of apertures 22a, 22b, 22c and 22d.

As is illustrated within FIG. 4, the series of patterned conductor layers 24a, 24b, 24c and 24d exhibits a chemical mechanical polish planarizing dishing process related deviation which correlates directly with a linewidth of a patterned conductor layer 24a, 24b, 24c or 24d (i.e., greater patterned conductor layer linewidth provides enhanced dishing). Such dishing provides for an incomplete filling of a particular aperture 22a, 22b, 22c or 22d and thus an influence upon a parasitic capacitance which is determined within the context of the patterned conductor layer 22a, 22b, 22c or 22d.

While FIG. 2 to FIG. 4 in a first instance illustrate a linewidth related chemical mechanical polish planarizing dishing process related deviation, the invention is not intended to be limited to modeling only such process related deviations within chemical mechanical polish planarizing processes. Rather, the present invention also contemplates modeling of enhanced dishing as a function of pattern density within a chemical mechanical polish planarizing method (i.e., as an areal density of patterned conductor layers formed employing a chemical mechanical polish planarizing method increases within a microelectronic product so also increases dishing of the series of patterned conductor layers). Under such circumstances, each of the apertures 22a, 22b, 22c and 22d as illustrated in FIG. 2 is of the same linewidth but the separation distances thereof differ such as to provide different areal densities (i.e., pattern densities) with differences in chemical mechanical polish planarizing dishing.

The present invention is intended to compensate for process related deviations such as the chemical mechanical polish planarizing dishing process related deviation as illustrated in FIG. 4, whether a linewidth related effect or a pattern density effect, when modeling and determining a parasitic capacitance within a microelectronic product.

Figure 5:
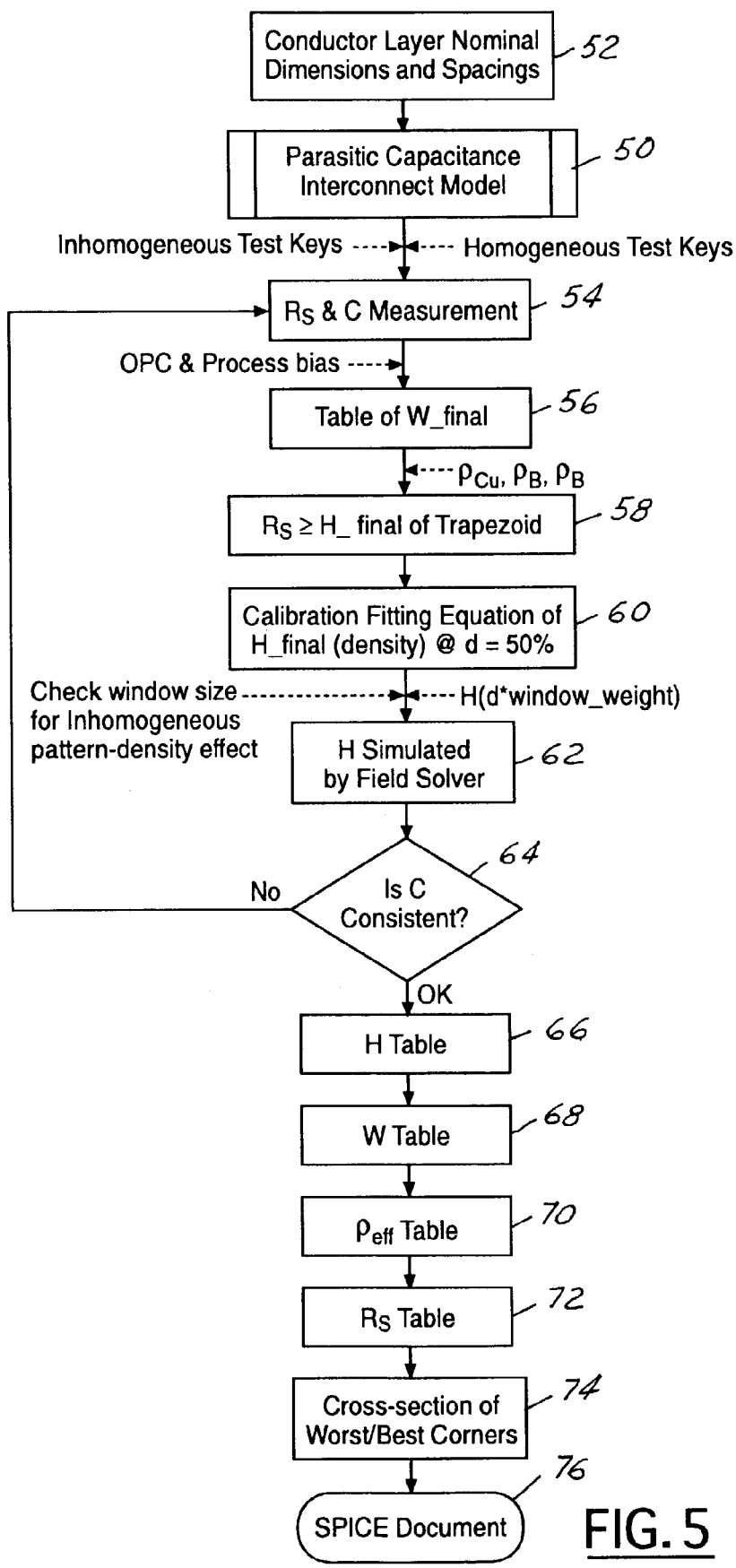
FIG. 5 shows a schematic process flow diagram illustrating in greater detail operation of the method of the invention.

FIG. 5 shows a schematic process flow diagram illustrating in greater detail operation of the method of the invention.

In accord with step 50 a parasitic capacitance interconnect model is provided, and in accord with process step 52 a series of conductor layer nominal dimensions and spacings is inputted into the parasitic capacitance interconnect model. The series of conductor layer nominal dimensions and spacings is obtained for a microelectronic product whose parasitic capacitance is desired to determine in accord with the invention.

After inputting the series of conductor layer nominal dimensions and spacings into the parasitic capacitance interconnect model, the invention also provides for inputting a series of inhomogeneous test keys and a series of homogeneous test keys into the parasitic capacitance interconnect model. Within the invention, and within the context of a chemical mechanical polish planarizing method, homogeneous test keys are intended as experimental test structures which are designed such as to be uniform and absent dishing over a chemical mechanical polish planarizing process window. The series of homogeneous test keys will thus typically be defined within the context of comparatively narrow linewidths in a range of from about 0.1 to about 0.5 microns and a comparatively low pattern density of less than about 25 percent. Inhomogeneous test key are intended as experimental test structures which are nonuniform and experience dishing over a chemical mechanical polish planarizing process window. The series of inhomogeneous test keys will thus typically be defined within the context of comparatively wider linewidths in a range of from about 5 to about 10 microns and a comparatively high pattern density of greater than about 80 percent. Both homogeneous test keys and inhomogeneous test keys may be designed and fabricated generally in accord with the microelectronic product as illustrated in FIG. 2 to FIG. 4, but often with only a single linewidth with respect to a series of patterned conductor layers formed employing a chemical mechanical polish planarizing method. The series of patterned conductor layers in plan view may be formed in any of several geometric dispositions, but will generally be discrete parallel lines connected in an appropriate fashion with bond pads.

In accord with process step 54, sheet resistance and capacitance measurements are obtained for the inhomogeneous test keys and the homogeneous test keys, and from these sheet resistance and capacitance measurements optical proximity correction (OPC) and process bias determinations may be experimentally determined or confirmed.

In accord with process step 56, an actual final width of patterned conductor layers is determined. Within the invention, an actual final width will generally be different from a nominal width of a patterned conductor layer since chemical mechanical polish planarizing dishing does not generally affect not only height of a conductor layer but also width of the patterned conductor layer.

When patterned conductor layers are formed of copper, a copper resistivity $\rho_{Cu}$, a barrier material resistivity $\rho_B$ and a barrier material thickness $\tau_B$ are also inputted. For other materials, appropriate resistivities and thicknesses may alternatively be inputted.

Process step 58 provides for determining from a measured sheet resistivity, an actual conductor layer width W, a copper resistivity $\rho_{Cu}$, a barrier material resistivity $\rho_B$ and a barrier material thickness $\tau_B$ an actual height H of a trapezoid cross-sectional shape which comprises a conductor layer actual dimension and spacing in accord with the invention.

Process step 60 provides, for example and without limitation, for calibration of a fitting equation for height H of a final trapezoid at a patterned conductor layer density of 50 areal percent. Subsequent to the calibration of the fitting equation a check is made for inhomogeneous pattern density effects.

Process step 62 provides for a simulation and determination (i.e., modeling) of parasitic capacitance for the series of patterned conductor layers of actual height H. The determination is undertaken within the context of field solver equations as are otherwise generally conventional in the microelectronic product fabrication art.

Process step 64 provides for a further inquiry as to whether the simulated parasitic capacitance as determined in step 62 is consistent (i.e., within about 5 to about 10 percent deviation) with respect to sheet resistance and capacitance measurements of the inhomogeneous test keys and homogeneous test keys. If not, a loop is reiterated by adjusting parameters and targeting at the sheet resistance and capacitance measurement data for the inhomogeneous test keys and the homogeneous test keys.

If the simulated capacitance is consistent, a height table 66, a width table 68, an effective resistivity table 70 and a sheet resistance table 72 are updated in accord with conductor layer actual dimensions and spacings for a microelectronic product in accord with the invention.

From the foregoing data, cross-sections of worst and best corners 74 (i.e., dimensions and spacings of patterned conductor layers) may be determined for a series of patterned conductor layers in accord with the invention.

Finally, in accord with process step 76, a SPICE product design document is generated to document conductor layer actual dimensions and spacings, and parasitic capacitances resulting therefrom.

While the invention has been discussed in methodologic terms, that invention also contemplates a computer apparatus which may operate in accord with the invention. General features of such a computer apparatus are disclosed within the prior art references cited within the Description of the Related Art. In addition, within the context of the instant invention, such a computer apparatus will comprise a computer having programmed therein a parasitic capacitance model which determines a parasitic capacitance based upon a series of conductor layer dimensions and spacings. The computer apparatus will also comprise a means for inputting (such as but not limited to a keyboard) into the parasitic capacitance model a series of conductor layer nominal dimensions and spacings whose parasitic capacitance is desired to be determined while employing the parasitic capacitance model. The computer apparatus will also comprise a means for inputting and correlating within the parasitic capacitance model experimentally determined conductor layer actual dimensions and spacings predicated upon a process related deviation, such as a chemical mechanical polish planarizing process related deviation. Finally, the computer apparatus will comprise a means, such as a microprocessor means, for determining a parasitic capacitance based upon the conductor layer actual dimensions and spacings.

The preferred embodiment of the invention is illustrative of the invention rather than limiting of the invention. Revisions and modifications may be made to methods, materials and dimensions in accord with the preferred embodiment of the invention, while still providing a method in accord with the invention, further in accord with the accompanying claims.

What is claimed is:

1. A method for determining a parasitic capacitance comprising:
    providing a parasitic capacitance model which determines a parasitic capacitance based upon a series of conductor layer dimensions and spacings;
    inputting into the parasitic capacitance model a series of conductor layer nominal dimensions and spacings whose parasitic capacitance is desired to be determined while employing the parasitic capacitance model;
    correlating experimentally within the parasitic capacitance model the series of conductor layer nominal dimensions and spacings with a process related deviation to provide a series of conductor layer actual dimensions and spacings; and
    determining, while employing the parasitic capacitance model, the parasitic capacitance based upon the conductor layer actual dimensions and spacings.

2. The method of claim 1 wherein the series of conductor layer dimensions and spacings is employed in fabricating a semiconductor product.

3. The method of claim 1 wherein the series of conductor layer dimensions and spacing is employed in fabricating a ceramic substrate product.

4. The method of claim 1 wherein the series of conductor layer nominal dimensions and spacing are in a range of from about 0.1 to about 10 microns.

5. The method of claim 1 wherein the process related deviation is selected from the group consisting of deposition process related deviations, etching process related deviations and planarizing process related deviations.

6. The method of claim 1 wherein the series of conductor layer nominal dimensions and spacings is correlated experimentally through use of a series of test structures.

7. The method of claim 1 wherein the process related deviation is a conductor layer linewidth process related deviation.

8. The method of claim 1 wherein the process related deviation is a conductor layer areal density process related deviation.

9. A method for determining a parasitic capacitance comprising:
    providing a parasitic capacitance model which determines a parasitic capacitance based upon a series of conductor layer dimensions and spacings;
    inputting into the parasitic capacitance model a series of conductor layer nominal dimensions and spacings whose parasitic capacitance is desired to be determined while employing the parasitic capacitance model;
    correlating experimentally within the parasitic capacitance model the series of conductor layer nominal dimensions and spacings with a planarizing process related deviation to provide a series of conductor layer actual dimensions and spacings; and
    determining, while employing the parasitic capacitance model, the parasitic capacitance based upon the conductor layer actual dimensions and spacings.

10. The method of claim 9 wherein the series of conductor layer dimensions and spacings is employed in fabricating a semiconductor product.

11. The method of claim 9 wherein the series of conductor layer dimensions and spacing is employed in fabricating a ceramic substrate product.

12. The method of claim 9 wherein the series of conductor layer nominal dimensions and spacing are in a range of from about 0.1 to about 10 microns.

13. The method of claim 9 wherein the series of conductor layer nominal dimensions and spacings is correlated experimentally through use of a series of test structures.

14. The method of claim 9 wherein the process related deviation is a conductor layer linewidth process related deviation.

15. The method of claim 9 wherein the process related deviation is a conductor layer areal density process related deviation.

16. An apparatus for determining a parasitic capacitance comprising:
    a computer having programmed therein a parasitic capacitance model which determines a parasitic capacitance based upon a series of conductor layer dimensions and spacings;
    means for inputting into the parasitic capacitance model a series of conductor layer nominal dimensions and spacings whose parasitic capacitance is desired to be determined while employing the parasitic capacitance model;
    means for correlating within the parasitic capacitance model the series of conductor layer nominal dimensions and spacings with an experimentally determined process related deviation also inputted into the parasitic capacitance model to provide a series of conductor layer actual dimensions and spacings; and
    means for determining, while employing the parasitic capacitance model, the parasitic capacitance based upon the conductor layer actual dimensions and spacings.

17. The apparatus of claim 16 wherein the process related deviation is selected from the group consisting of deposition process related deviations and etching process related deviations.

18. The apparatus of claim 16 wherein the process related deviation is a planarizing process related deviations.

19. The apparatus of claim 16 wherein the process related deviation is a conductor layer linewidth process related deviation.

20. The apparatus of claim 16 wherein the process related deviation is a conductor layer.

* * * * *